United States Patent
Seo (10) Patent No.: US 10,453,539 B2
(45) Date of Patent: Oct. 22, 2019

(54) DEVICE FOR DETECTING LEAKAGE CURRENT AND MEMORY DEVICE

(71) Applicant: SAMSUNG ELECTRONICS CO., LTD., Suwon-si, Gyeonggi-do (KR)

(72) Inventor: Sung Whan Seo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/690,768

(22) Filed: Aug. 30, 2017

(65) Prior Publication Data

US 2018/0190360 A1    Jul. 5, 2018

(30) Foreign Application Priority Data

Jan. 3, 2017 (KR) .................. 10-2017-0000632

(51) Int. Cl.
| | | |
|---|---|---|
| *G11C 11/34* | (2006.01) | |
| *G11C 16/30* | (2006.01) | |
| *G06F 1/10* | (2006.01) | |
| *H02M 3/07* | (2006.01) | |
| *H02M 1/32* | (2007.01) | |
| *G11C 29/02* | (2006.01) | |
| *G11C 5/14* | (2006.01) | |

(52) U.S. Cl.
CPC ............... *G11C 16/30* (2013.01); *G06F 1/10* (2013.01); *G11C 29/021* (2013.01); *H02M 1/32* (2013.01); *H02M 3/07* (2013.01); *G11C 5/145* (2013.01); *H02M 3/073* (2013.01)

(58) Field of Classification Search
CPC ..................................... G11C 16/10

USPC ...................................... 365/185.18
See application file for complete search history.

(56) References Cited

U.S. PATENT DOCUMENTS

| | | | | |
|---|---|---|---|---|
| 5,418,751 | A | | 5/1995 | Kaiser |
| 5,774,404 | A | * | 6/1998 | Eto .............. G11C 11/406 365/148 |
| 5,941,990 | A | * | 8/1999 | Hiiragizawa ....... G06F 1/3203 713/310 |
| 6,219,293 | B1 | * | 4/2001 | Butler ............ G11C 11/4074 365/189.09 |
| 6,359,809 | B1 | * | 3/2002 | Tedrow ............. G11C 5/145 365/185.21 |
| 7,250,807 | B1 | * | 7/2007 | Doyle .............. G05F 3/205 327/534 |
| 7,602,168 | B2 | * | 10/2009 | Wang ................ H02M 3/07 323/282 |
| 8,018,240 | B2 | | 9/2011 | Kajita |
| 8,049,550 | B2 | | 11/2011 | Rozen et al. |
| 8,537,625 | B2 | | 9/2013 | Ramaraju et al. |
| 9,188,998 | B2 | | 11/2015 | Yano et al. |
| 9,443,610 | B1 | * | 9/2016 | Pan ................ G11C 29/025 |
| 9,812,960 | B2 | * | 11/2017 | Kunz ................ H02M 3/158 |

(Continued)

FOREIGN PATENT DOCUMENTS

| | | |
|---|---|---|
| JP | 2007-219861 A | 8/2007 |
| JP | 2008-219470 A | 9/2008 |

*Primary Examiner* — Hoai V Ho
(74) *Attorney, Agent, or Firm* — Lee & Morse, P.C.

(57) ABSTRACT

A memory device includes a controller and a power circuit for a plurality of memory cells. The power circuit detects the frequency of at least one clock signal generated in the power circuit and generates comparative data based on the frequency. The controller detects leakage current in the power based on the comparative data.

8 Claims, 11 Drawing Sheets

(56) References Cited

U.S. PATENT DOCUMENTS

| | | | |
|---|---|---|---|
| 9,941,016 B2* | 4/2018 | Shim | G11C 16/3495 |
| 2013/0063152 A1 | 3/2013 | Kasashima et al. | |
| 2014/0145770 A1* | 5/2014 | Kropp | H03L 7/0814 |
| | | | 327/158 |
| 2015/0220065 A1* | 8/2015 | Suma Vinay | G04F 10/105 |
| | | | 341/166 |
| 2015/0263507 A1 | 9/2015 | Endo et al. | |

\* cited by examiner

DEVICE FOR DETECTING LEAKAGE CURRENT AND MEMORY DEVICE

CROSS-REFERENCE TO RELATED APPLICATION

Korean Patent Application No. 10-2017-0000632, filed on Jan. 3, 2017, and entitled, "Device for Detecting Leakage Current and Memory Device," is incorporated by reference herein in its entirety.

BACKGROUND

1. Field

One or more embodiments relate to a device for detecting leakage current and a memory device.

2. Description of the Related Art

A memory device includes memory cells for storing data. The memory cells are controlled to perform data writing, data deletion, and data reading operations based on control signals transmitted on driving lines. Various voltages may be used to perform these operations. When leakage current occurs in the memory cells, driving lines, or other electrical wiring, the stored data may be lost or inaccurately read.

SUMMARY

In accordance with one or more embodiments, a device for detecting a leakage current includes an oscillator to output an operating clock signal of a first frequency; a charge pump to operate based on the operating clock signal and to generate driving power for a plurality of memory cells; and a counter to detect the frequency of the operating clock signal and to generate comparative data to detect a leakage current in the driving power.

In accordance with one or more other embodiments, a device for detecting a leakage current includes a voltage generator to output direct current (DC) power; a current mirror to replicate a current of the DC power and output a first current and a second current; an oscillator to be driven by the first current and the second current to generate a clock signal of a frequency that is based on the first current and the second current; and a counter to detect the frequency of the clock signal and to generate comparative data to detect a leakage current in the current of the DC power.

In accordance with one or more other embodiments, a memory device includes a plurality of memory elements; a controller integrated circuit (IC) to control the plurality of memory elements; and a power circuit to output driving power for the controller IC and the plurality of memory elements, wherein the power circuit is to detect a frequency of at least one of clock signals generated in the power circuit and to generate comparative data and wherein the controller IC is to detect a leakage current in the driving power based on the comparative data.

In accordance with one or more other embodiments, a memory device includes a plurality of memory cells; and built-in logic to detect leakage current in power for controlling the plurality of memory cells.

BRIEF DESCRIPTION OF DRAWINGS

Features will become apparent to those of skill in the art by describing in detail exemplary embodiments with reference to the attached drawings in which.

DETAILED DESCRIPTION

Figure 1:
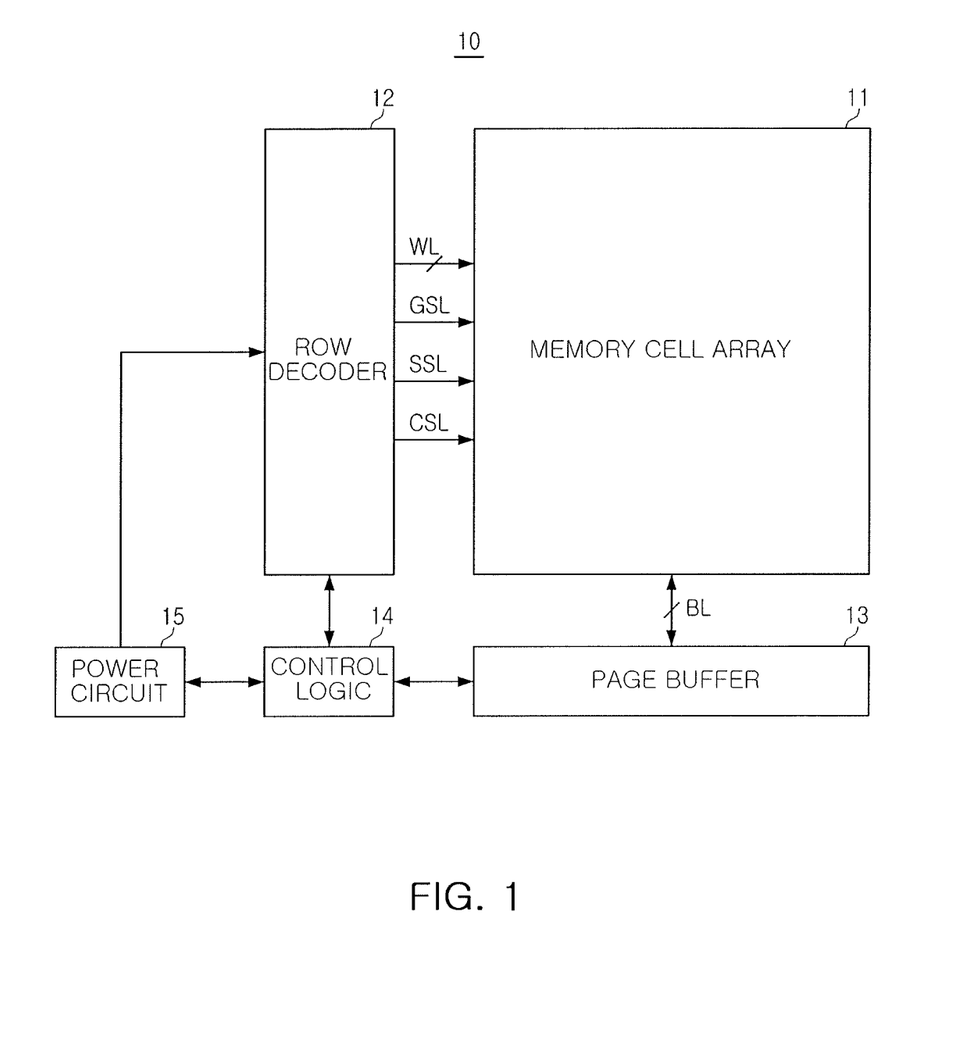
FIG. 1 illustrates an embodiment of a memory device.

FIG. 1 illustrates an embodiment of a memory device 10 may include a memory cell array 11, a row decoder 12, a page buffer 13, a control logic 14, and a power circuit 15. In an example embodiment, the row decoder 12, the page buffer 13, the control logic 14, and the power circuit 15 may embodied in a single integrated circuit (IC).

The memory cell array 11 may include a plurality of memory cells arranged in rows and columns. The memory cells may be connected to the row decoder 12 by one or more word lines WL, one or more common source lines CSL, one or more string select line SSL, and one or more ground select line GSL. The memory cells may be connected to the page buffer 13 by a bit line BL. The memory cells in the memory cell array 11 may form a plurality of memory strings.

The memory cells may be divided into a plurality of memory blocks. Each of the memory blocks may be connected to a plurality of word lines WLs, a plurality of string select lines SSLs, a plurality of ground select lines GSLs, a plurality of bit lines BLs, and at least one common source line CSL.

The row decoder 12 may receive address information from an external source, and may decode the received address information to determine the magnitude of voltage supplied to at least a portion of the word lines WLs, the common source lines CSLs, the string select lines SSLs, and the ground select lines GSLs connected to the memory cell array 11.

The page buffer 13 may select at least a portion of the bit lines BL connected to the memory cell array 11 according to an instruction from the control logic 14. The page buffer 13 may read data stored in the memory cell(s) connected to the selected at least a portion of the bit lines BLs or may write data to the memory cell(s) connected to the selected at least a portion of the bit lines BLs.

The control logic 14 may control the row decoder 12 and the page buffer 13. In an example embodiment, the control logic 14 may include an interface connected to an external host and may control the row decoder 12 and the page buffer 13, for example, according to an instruction from a host received via the interface. In the case of reading data stored in the memory cell array 11, the control logic 14 may control the row decoder 12 to supply a voltage to the word line WL for performing a reading operation from a memory cell in which the data is stored. When a voltage for a data reading operation is supplied to a certain word line WL, control logic 14 may control the page buffer 13 to read data stored in the memory cell connected to the certain word line WL.

When data is written to the memory cell array 11, control logic 14 may control the row decoder 12 to supply a voltage to a word line WL for performing a data writing operation for a memory cell. When a voltage for the data writing operation is supplied to a certain word line WL, control logic 14 may control the page buffer 13 to write data to the memory cell connected to the certain word line WL.

In an example embodiment, a voltage for performing a data reading operation and a voltage for a data writing operation may have different values. The voltages for performing data reading, data writing, and data deletions operations may be generated, for example, by the power circuit 15.

The power circuit 15 may include a charge pump, an oscillator, a voltage regulator, and a voltage-current conversion circuit for generating various magnitudes of voltage. The various magnitudes of voltage may be output by the power circuit 15 to maintain stable performance of the memory device 10. However, when leakage current has occurred due to a defect in a manufacturing process of the memory device 10 or a progressive defect that occurs during use of the memory device 10, the leakage current may reduce a voltage output from the power circuit 15. Further, when leakage current flows into the memory cell array 11, data written to the memory cells may be lost. In order to solve these issues, in an example embodiment, a device may be provided in the memory device 10 for detecting leakage current caused by a manufacturing process defect or a progressive defect occurring during use of the memory device 10.

Figure 2:
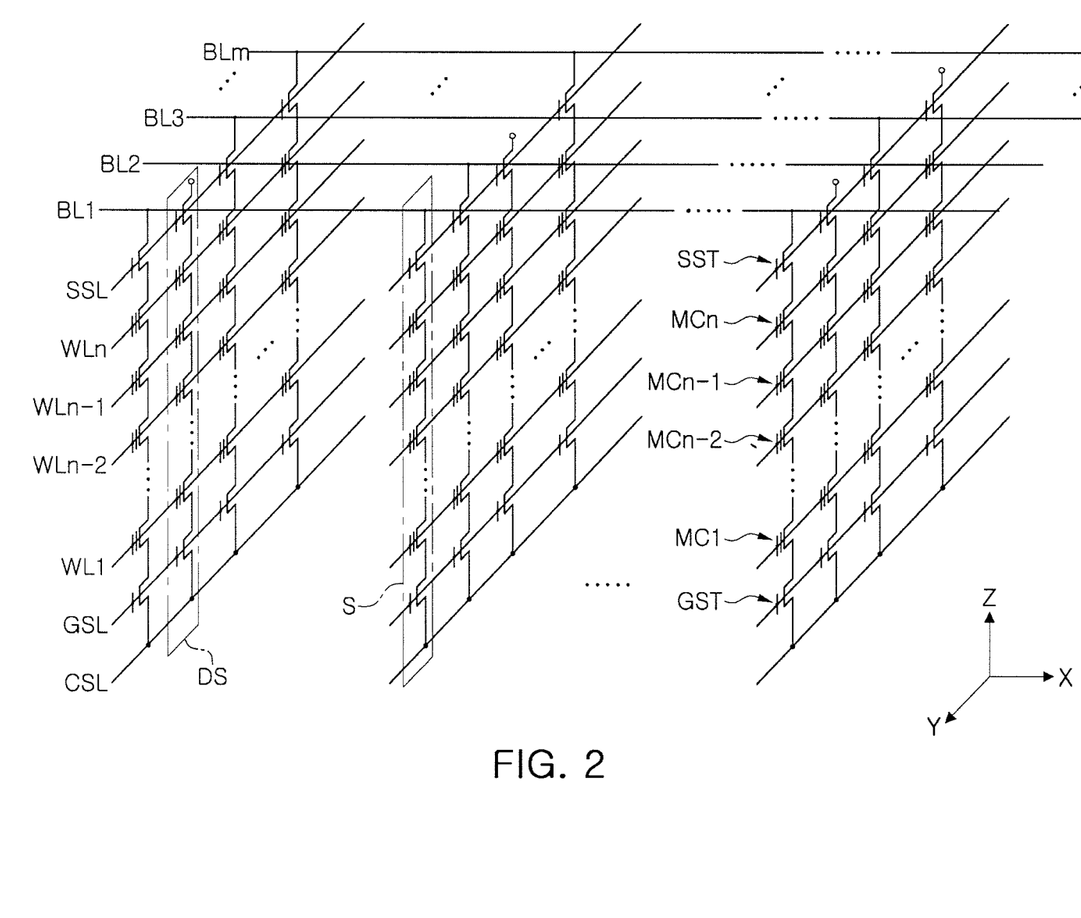
FIG. 2 illustrates an embodiment of a memory cell array.

FIG. 2 illustrates an embodiment of a memory cell array 11, which, for example, may be in the memory device 10. The memory device including the memory cell array 11 may be, for example, a vertical flash memory device having a channel region that extends in a direction perpendicular to a semiconductor substrate.

Referring to FIG. 2, the memory cell array 11 may include memory cell strings S, each including n memory cells MC1 to MCn connected to each other in series, and a ground select transistor GST and a string select transistor SST connected to ends of the n memory cells MC1 to MCn in series. The n memory cells MC1 to MCn may be connected to n word lines WL1 to WLn for selecting respective ones of the memory cells MC1 to MCn. Further, a dummy cell may be between the ground select transistor GST and the first memory cell MC1 and/or between the string select transistor SST and the n-th memory cell MCn.

The ground select transistor GST may have a gate terminal connected to a ground select line GSL and a source terminal connected to a common source line CSL. The string select transistor SST may have a gate terminal connected to a string select line SSL and a source terminal connected to a drain terminal of the n-th memory cell MCn. FIG. 2 illustrates a structure in which a single ground select transistor GST and a single string select transistor SST are connected to the n memory cells MC1 to MCn, which are connected to each other in series. In a different manner, a plurality of ground select transistors GST or a plurality of string select transistors SST may also be connected to the n memory cells MC1 to MCn.

The string select transistor SST may have a drain terminal connected to a plurality of bit lines BL1 to BLm. When a signal is applied to the gate terminal of the string select transistor SST through the string select line SSL, the signal applied through the bit lines BL1 to BLm may be transmitted to the n memory cells MC1 to MCn and a data reading/writing operation may thus be performed. Further, a data erasing operation for erasing data stored in the n memory cells MC1 to MCn may be performed by applying an erase voltage at a predetermined level to the n memory cells MC1 to MCn through a well region in a substrate.

Referring to FIG. 2, a memory device according to an example embodiment may include at least one dummy string DS. The at least one dummy string DS may include a dummy channel which is not connected to the bit lines BL1 to BLm. The at least one dummy string DS may be in the vertical flash memory device in order to increase structural stability.

Figure 3:
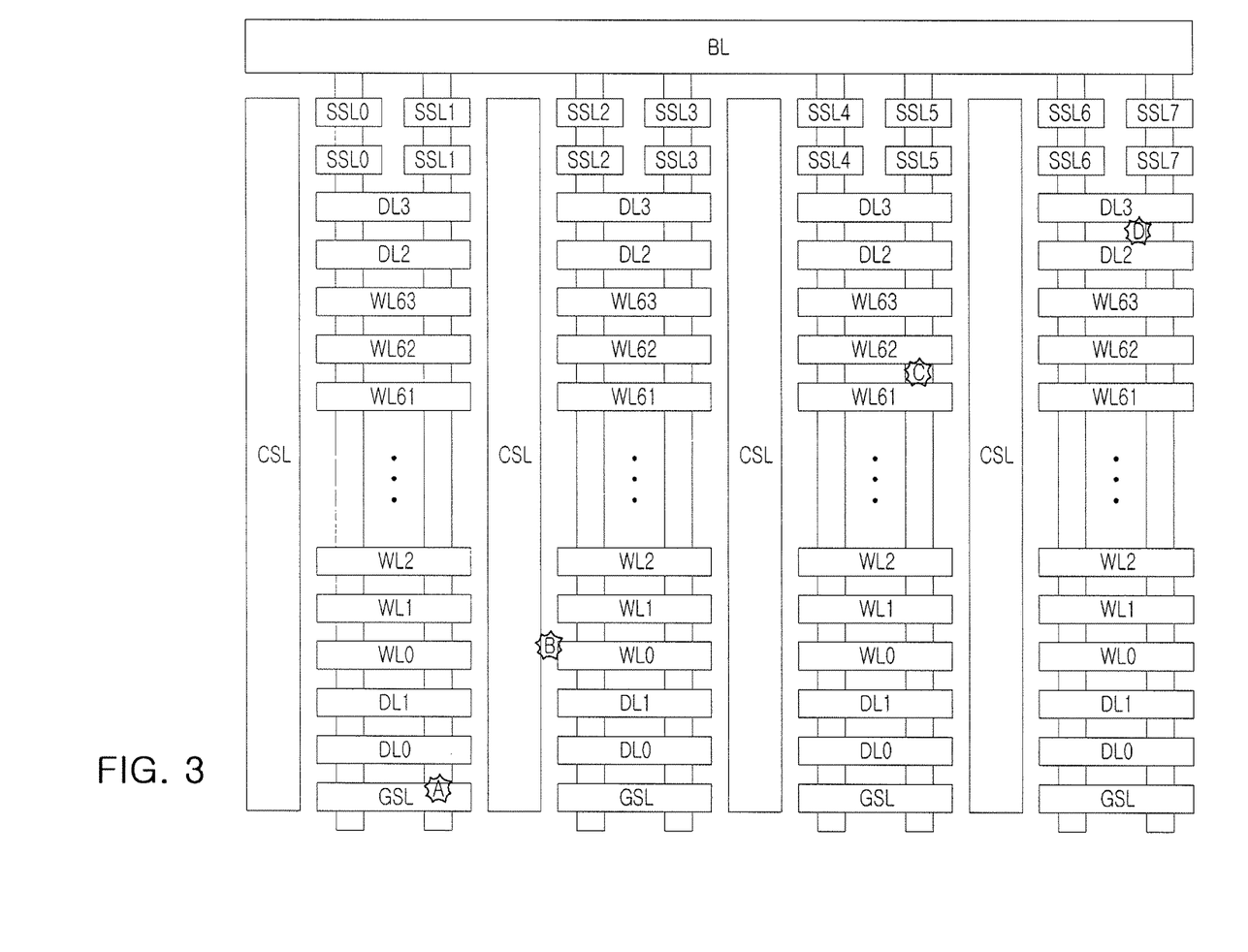
FIG. 3 illustrates examples of defects that may occur in a memory device.

FIG. 3 illustrates an example of defects that may occur in a memory device. The defects may be a progressive defect that occurs in the memory device 10 while in use and/or defects resulting from a manufacturing process of the memory device. The memory device in FIG. 3 may be, for example, a vertical flash memory device.

Referring to FIG. 3, a single ground select line GSL, two lower dummy lines DL0 and DL1, 64 word lines WL0 to WL63, two upper dummy lines DL2 and DL3, and two string select lines SSL0 to SSL7 may be sequentially stacked from below, in each memory block. A common source line CSL may be a source line of a channel region extending in a direction perpendicular to a substrate. The number of the above-mentioned lines may be different in other embodiments.

As illustrated in FIG. 3, Defect A may occur in the ground select line GSL. In an example embodiment, defect A may be a progressive defect that occurs between the ground select line GSL and a channel region CH or between the ground select line GSL and the common source line CSL. Defect B may occur between the common source line CSL and at least one of the word lines WL0 to WL63. Defect C may occur between the word lines WL0 to WL63, e.g., a defect directly connected to the channel region may occur in the word lines WL0 to WL63. Defect D may occur between the dummy lines DL0 to DL3 and the channel region. A progressive defect in the memory device may occur in various forms, e.g., forms different from those illustrated in FIG. 3. These and other defects may increase the amount of leakage current in the memory device.

Figure 4A:
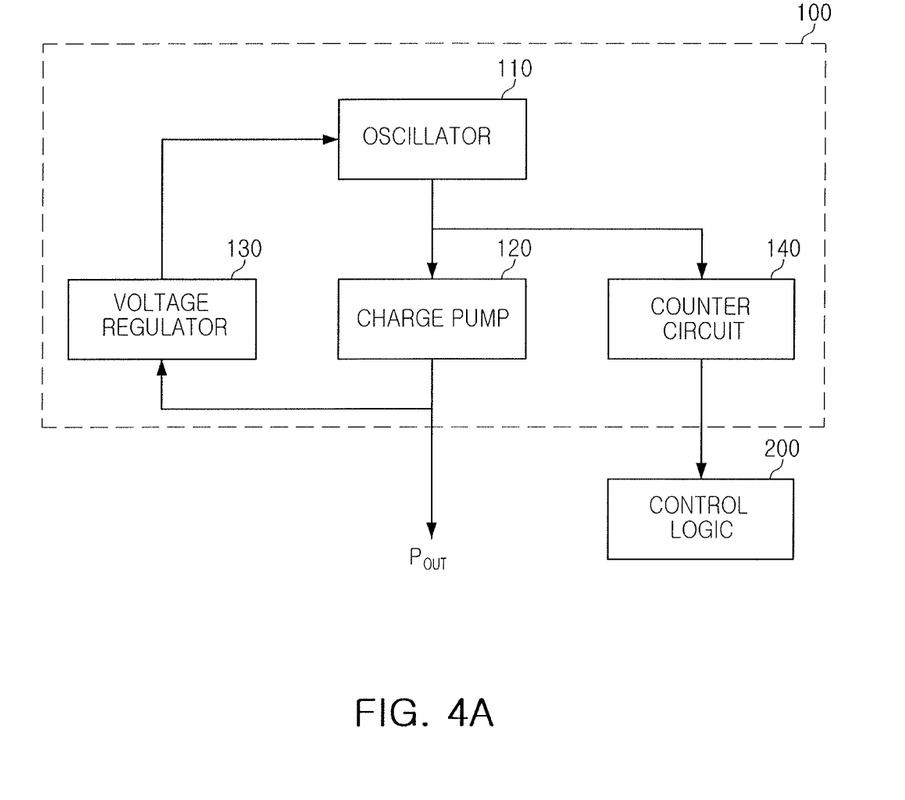
FIGS. 4A-4B illustrate embodiments of a device to detect leakage current.
Figure 4B:
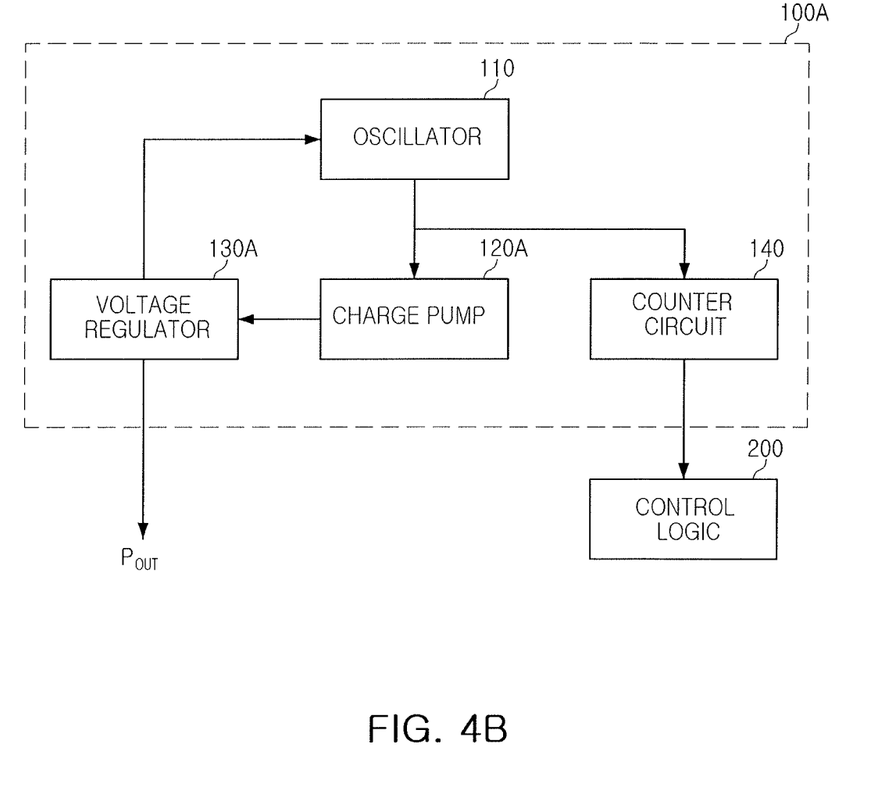

FIGS. 4A and 4B illustrate embodiments of a device (e.g., built-in logic) for detecting leakage current. Referring to FIG. 4A, the device is a power circuit (e.g., built-in logic) 100 that includes an oscillator 110, a charge pump 120, a voltage regulator 130, and a counter circuit 140. The oscillator 110 generates an operating clock signal having a first frequency. In an example embodiment, the oscillator 110 may include a clock generator for generating a reference clock signal and a clock multiplexer for generating an operating clock signal based on the reference clock signal. The reference clock signal may have a second frequency different from the first frequency. In an example embodiment, the first frequency may be lower than the second frequency.

The charge pump 120 may operate based on the operating clock signal from the oscillator 110 in order to generate driving power $P_{OUT}$. The driving power $P_{OUT}$ may be supplied to a plurality of memory cells and may have various magnitudes of voltage for performing predetermined operations, e.g., data writing, data reading, and/or data deletion. The driving power $P_{OUT}$ may be supplied to a memory cell array through a row decoder or a page buffer.

The voltage regulator 130 may regulate the voltage of the driving power $P_{OUT}$ output from the charge pump 120. The oscillator 110 may adjust the first frequency of the operating clock signal supplied to the charge pump 120 based on the magnitude of leakage current in the output of the voltage regulator 130.

When a defect occurs in at least a portion of memory cells operating based on driving power $P_{OUT}$, a short or another type of defect may occur between components that are intended to be electrically isolated from each other. As a result, leakage current caused may be reflected in the driving power $P_{OUT}$. The leakage current may cause the voltage magnitude of the driving power $P_{OUT}$ to decrease. In order to prevent a decrease in the voltage of the driving power $P_{OUT}$, the first frequency of the operating clock signal output from the oscillator 110 to the charge pump 120 may increase.

As illustrated in FIG. 4A, the operating clock signal, input to the charge pump 120, may be detected by the counter circuit 140. The counter circuit 140 may count the number of cycles of the operating clock signal during a predetermined time period, and may calculate the first frequency of the operating clock signal based on the counted number. The first frequency, detected by the counter circuit 140, may be transmitted to control logic 200 to be used as comparative data for detecting a leakage current.

In an example embodiment, control logic 200 may be in the memory device for controlling predetermined operations, e.g., data writing, data reading, and/or data deletion. In one example embodiment, control logic 200 may also be provided as a logic circuit outside the memory device, for example, a logic circuit in a host connected to the memory device.

The comparative data received by control logic 200 from the counter circuit 140 may include the first frequency converted to digital form. The control logic 200 may compare the first frequency, in the comparative data, with a predetermined reference range. The reference range may include, for example, the threshold value of the first frequency corresponding to the case where leakage current does not occur or where leakage current is of sufficiently low magnitude to allow for normal operations.

The control logic 200 may determine whether the memory device may operate regardless of the leakage current by comparing the first frequency with the reference range. When the first frequency is outside the reference range, control logic 200 may determine that a memory cell string, or a memory block including a memory cell to which the driving power $P_{OUT}$ is supplied, is disabled. Further, control logic 200 may notify the user of the memory device that a disabled situation has occurred in the memory device due to the leakage current. In an example embodiment, control logic 200 may control counter circuit 140 to detect the first frequency every predetermined cycle, and may compare the first frequency with the reference range to determine whether the memory device is operating normally.

Referring to FIG. 4B, a power circuit 100A may include an oscillator 110, a charge pump 120A, a voltage regulator 130A, and a counter circuit 140. Driving power $P_{OUT}$ output from the charge pump 120A may be stabilized by the voltage generator 130A and supplied to memory cells. In an example embodiment, the voltage regulator 130A may include a plurality of regulator circuits for outputting different voltages.

Figure 5:
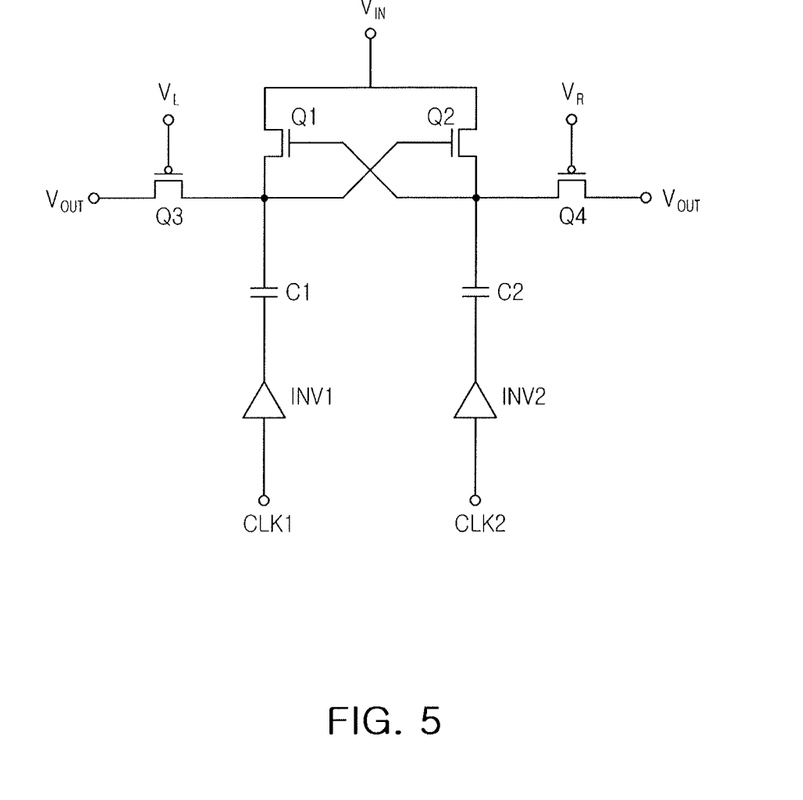
FIGS. 5 and 6 illustrate examples of charge pumps in FIGS. 4A and 4B.
Figure 6:
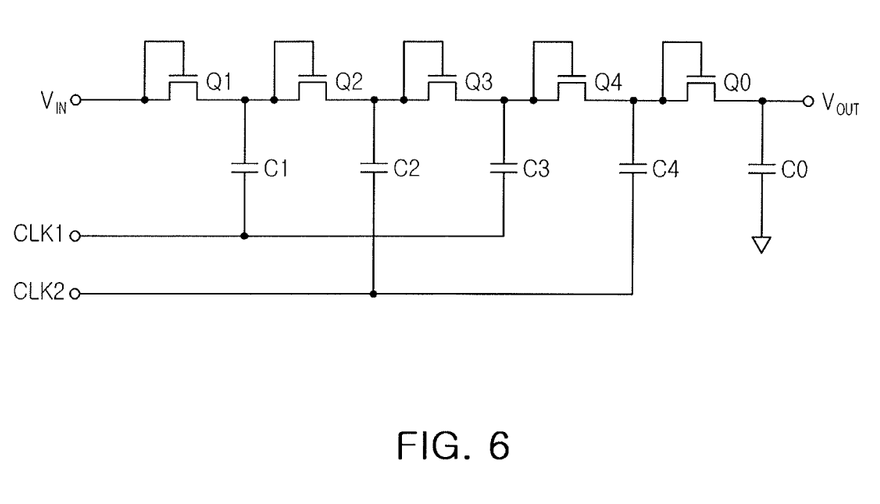

FIGS. 5 and 6 illustrate embodiments of the charge pump 120 in FIG. 4. In another embodiment, charge pump 120 may have a different structure.

Referring to FIG. 5, the charge pump 120 may be a cross-coupled charge pump circuit for amplifying an input voltage $V_{IN}$ in order to generate an output voltage $V_{OUT}$.

The charge pump circuit may include first to fourth transistors Q1 to Q4, first and second capacitors C1 and C2, and first and second inverters INV1 and INV2. The first and second transistors Q1 and Q2 may be N-channel metal oxide semiconductor (NMOS) transistors. The third and fourth transistors Q3 and Q4 may be P-channel metal oxide semiconductor (PMOS) transistors. Turning on/off of the first and second transistors Q1 and Q2 may be performed based on first and second clock signals CLK1 and CLK2 having complementary characteristics. Turning on/off of the third and fourth transistors Q3 and Q4 may be performed based on first and second voltage signals $V_L$ and $V_R$ input to respective gate terminals. The first and second voltage signals $V_L$ and $V_R$ may be clock signals having complementary characteristics.

When the first clock signal CLK1 has a high value and the second clock signal CLK2 has a low value, the first transistor Q1 may be turned on and the second transistor Q2 may be turned off. When the first transistor Q1 is turned on, the first capacitor C1 may be charged with the input voltage $V_{IN}$. When the first clock signal CLK1 has a low value and the second clock signal CLK2 has a high value, the output of the first inverter INV1 may have a high value. Thus, the voltage of the first capacitor C1 may increase to a level twice that of the input voltage $V_{IN}$. The first voltage signal VL may have a low value. Thus, the output voltage $V_{OUT}$ may be output through an output terminal connected to the third transistor Q3.

While the voltage of the first capacitor C1 is output to the output terminal connected to the third transistor Q3, the second capacitor C2 may be charged with the input voltage $V_{IN}$. When the first clock signal CLK1 has a high value and the second clock signal CLK2 has a low value, the output of the second inverter INV2 may cause the voltage of the second capacitor C2 to increase to a level twice that of the input voltage $V_{IN}$.

The magnitude of current output by the charge pump circuit may be based on the frequencies of the first and second clock signals CLK1 and CLK2 or on the frequencies of the first and second voltage signals $V_L$ and $V_R$ having clock signal characteristics. In an example embodiment, when the frequencies of the first and second clock signals CLK1 and CLK2 and the first and second voltage signals VL and VR input to the charge pump circuit increase, the magnitude of the current output by the charge pump circuit may increase.

When leakage current occurs due to a defect or a progressive defect (e.g., according to design and a process in the memory cell operating with power supplied from the charge pump circuit), the frequencies of the first and second clock signals CLK1 and CLK2 and the first and second voltage signals $V_L$ and $V_R$ may be increased, by increasing an amount of current output by the charge pump circuit, in order to compensate for the leakage current. In an example embodiment, the counter circuit in or out of the power circuit may detect the frequencies of the first and second clock signals CLK1 and CLK2 and the first and second voltage signals $V_L$ and $V_R$. The detected frequencies may be provided to the control logic. When the frequency detected by the counter circuit is outside of a predetermined reference range, the control logic may determine that leakage current having a high magnitude sufficient to disable normal operations has occurred, and may determine that the memory device is disabled.

Referring to FIG. 6, the charge pump circuit may include zeroth to fourth transistors Q0 to Q4 and zeroth to fourth capacitors C0 to C4. The transistors Q0 to Q4 may be, for example, NMOS transistors having drain and gate terminals connected to each other to function as a diode.

The charge pump circuit may receive a first clock signal CLK1 or a second clock signal CLK2 through the first to fourth capacitors C1 to C4, except for the output capacitor (e.g., zeroth capacitor C0) connected to an output terminal. In an example embodiment, the first and second clock signals CLK1 and CLK2 may have complementary characteristics.

During a first half cycle, the first clock signal CLK1 may have a low value, the second clock signal CLK2 may have a high value, and the first capacitor C1 may be charged with an input voltage $V_{IN}$. During a subsequent half cycle, the first clock signal CLK1 may have a high value, the second clock signal CLK2 may have a low value, and the first clock signal CLK1 may cause the voltage of the first capacitor C1 to increase to a level twice that of the input voltage $V_{IN}$. Further, the first transistor Q1 may be turned off, the second transistor Q2 may be turned on. Thus, the voltage of the second capacitor C2 may increase to a level twice that of the input voltage $V_{IN}$.

During a subsequent half cycle, the first clock signal CLK1 may have a low value, the second clock signal CLK2 may have a high value, the second clock signal CLK2 may cause the voltage of the second capacitor C2 to increase to a level three times that of the input voltage $V_{IN}$, and the third capacitor C3 may be charged with the voltage of the second capacitor C2. Through such a process, the charge pump circuit may amplify the input voltage $V_{IN}$ to generate an output voltage $V_{OUT}$. For example, when the charge pump circuit includes an N number of transistors, the output voltage $V_{OUT}$ may be N times the input voltage $V_{IN}$.

Similarly with an example embodiment illustrated in FIG. 5, the magnitude of a leakage current in the output of the charge pump circuit, illustrated in FIG. 6, may be proportionate to the frequencies of the first and second clock signals CLK1 and CLK2. For example, when leakage current occurs in a memory cell or a wiring line receiving driving power from the charge pump circuit, the frequencies of the first and second clock signals CLK1 and CLK2 may increase in order to compensate for (e.g., completely or partially offset) the amount of current lost by leakage current.

In an example embodiment, the frequencies of the first and second clock signals CLK1 and CLK2, input to the charge pump circuit, may be detected and compared to a predetermined reference range to estimate whether leakage current has occurred and/or to determine the magnitude of leakage current. The first and second clock signals CLK1 and CLK2 may be supplied from an oscillator. An output terminal of the oscillator may be connected to the counter circuit to detect the frequencies of the first and second clock signals CLK1 and CLK2. The frequencies of the first and second clock signals CLK1 and CLK2, detected by the counter circuit, may be transmitted to the control logic. The control logic may determine whether leakage current has occurred and/or the magnitude of leakage current based on the frequencies of the first and second clock signals CLK1 and CLK2.

Figure 7:
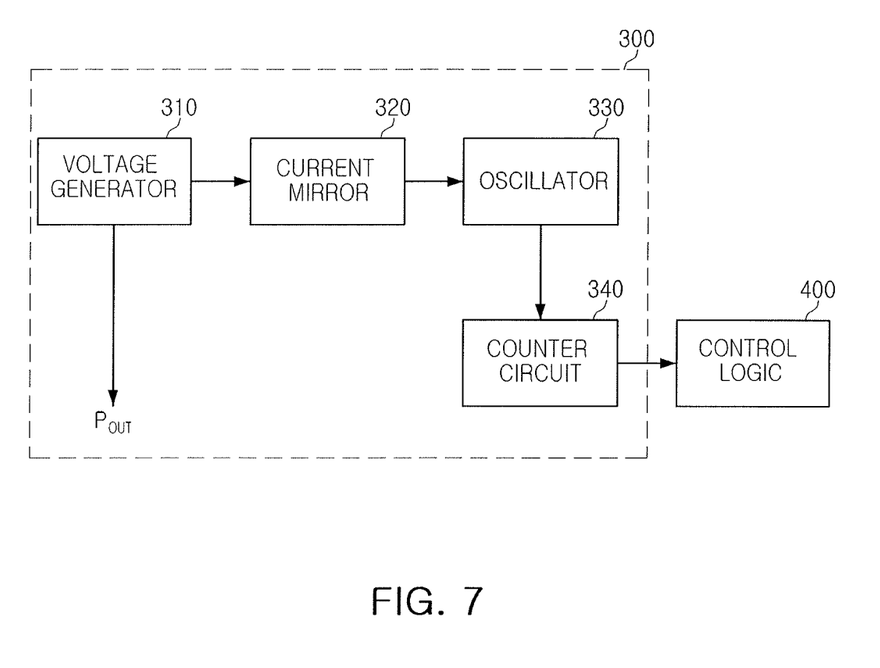
FIG. 7 illustrates another embodiment of a device to detect leakage current.

FIG. 7 illustrates another embodiment of a device for detecting leakage current, for example, in memory device 10. As illustrated in FIG. 7, the device is a power circuit 300 (e.g., built-in logic) which includes a voltage generator 310, a current mirror 320, an oscillator 330, and a counter circuit 340. The power circuit 300 may be a power management integrated circuit (PMIC) that does not include a charge pump.

The voltage generator 310 may include a circuit that receives a predetermined level of reference voltage to output a direct current (DC) voltage. In an example embodiment, the voltage generator 310 may operate as a constant current source that outputs constant current. This current may be replicated by the current mirror 320 and may be input to the oscillator 330.

The oscillator 330 may be, for example, a ring oscillator that includes a plurality of inverter circuits connected to each other in series. The frequency of a clock signal output from the oscillator 330 may vary depending, for example, on the magnitude of current input to the oscillator 330. In an example embodiment, when the magnitude of current input to the oscillator 330 increases, the frequency of a clock signal output from the oscillator 330 may increase. The counter circuit 340 may detect the frequency of the clock signal output from the oscillator 330.

For example, as illustrated in FIG. 7, the frequency of the clock signal output from the oscillator 330 may increase or decrease in proportion to the current output from the voltage generator 310. When leakage current occurs in driving power $P_{OUT}$ output from the voltage generator 310 to a memory cell or a wiring line, the magnitude of current output by the voltage generator 310 may increase to compensate for the leakage current. Therefore, the frequency of the clock signal output from oscillator 330 may increase or decrease in proportion to the leakage current in the driving power $P_{OUT}$.

The counter circuit 340 may detect the frequency of the clock signal output from the oscillator 330 and may transmit the detected frequency to the control logic 400. The control logic 400 may determine whether leakage current has occurred or the magnitude of the leakage current by comparing the detected frequency with a predetermined reference range. When it is determined that the magnitude of the leakage current is greater than a constant threshold value, control logic 400 may determine that a memory block or the like including a corresponding memory cell is disabled.

Figure 8:
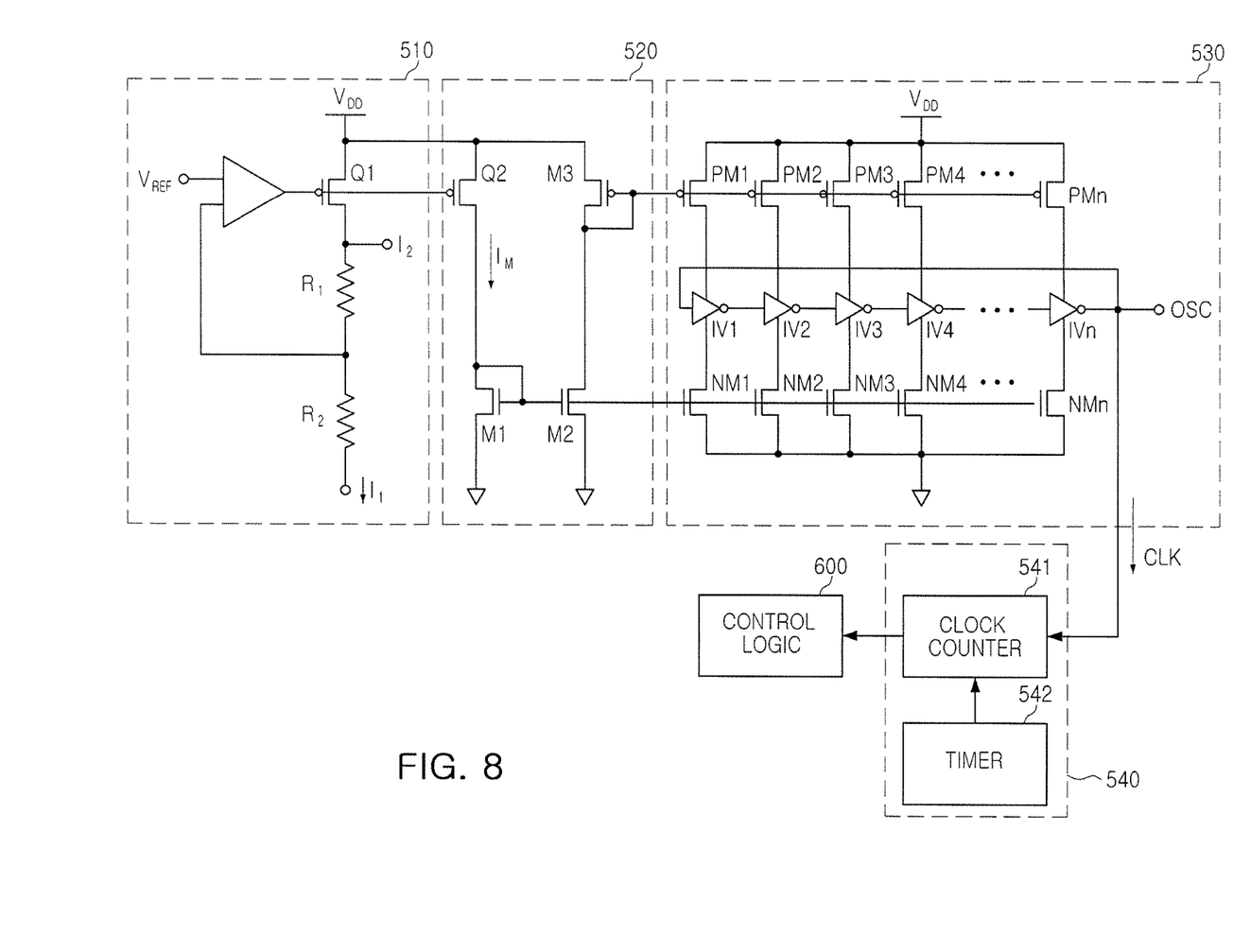
FIG. 8 illustrates another embodiment of a device to detect leakage current.

FIG. 8 illustrates another embodiment of a device for detecting leakage current, which, for example, may correspond to the power circuit 300 in FIG. 7. Referring to FIG. 8, a voltage generator 510 may include a first transistor Q1 having an operational amplifier, first and second resistors $R_1$ and $R_2$, and a gate terminal connected to an output terminal of the operational amplifier. A current mirror 520 may include a second transistor Q2 having a gate terminal connected to the output terminal of the operational amplifier as in the first transistor Q1, and third to fifth transistors M1 to M3.

The sum of an output current $I_2$ of the voltage generator 510 and a current $I_1$, flowing through the first and second resistors R1 and R2, may be replicated in the second transistor Q2 of the current mirror 520. For example, a current $I_M$ flowing in the second transistor Q2 of current mirror 520 may be substantially the same value as $I_1+I_2$.

The current $I_M$, flowing in the second transistor Q2 may be secondarily replicated by the third to fifth transistors M1 to M3 and may be input to gate terminals of n PMOS transistors PM1 to PMn and n NMOS transistors NM1 to NMn in a ring oscillator 530, where n is an odd number. The counter circuit 540 may detect the frequency of a clock signal CLK output by the ring oscillator 530.

The counter circuit 540 may include a clock counter 541 and a timer 542. The clock counter 541 may count the number of cycles of the clock signal CLK during a predetermined period of time. The timer 542 may determine the predetermined period of time at which the clock counter 541 may count the number of cycles of the clock signal CLK. A control logic 600 may compare the frequency of the clock signal CLK detected by the counter circuit 540 with a predetermined reference range to estimate whether leakage current has occurred and/or the magnitude of leakage current.

Figure 9:
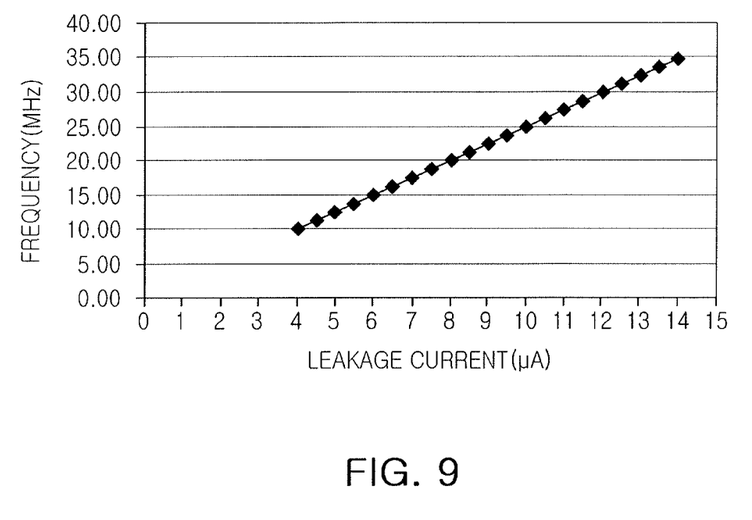
FIG. 9 illustrates another embodiment of a device to detect leakage current.

FIG. 9 illustrates an example of the operation of the device (e.g., built-in logic) for detecting a leakage current illustrated in FIG. 8. More specifically, FIG. 9 illustrates changes in the frequency magnitude of a clock signal CLK based on the magnitude of leakage current in an output current of the voltage generator 510. For example, when the leakage current exceeds 4 uA, the frequency may increase in proportion to the leakage current. The clock counter 541 may conversely estimate the magnitude of the leakage current in the output current of the voltage generator 510 by measuring the frequency of the clock signal CLK output from the oscillator 530.

The control logic 600 may compare the magnitude of the leakage current with a predetermined reference range. In an example embodiment, control logic 600 may not determine that the memory device is disabled with respect to leakage current having a magnitude lower than a predetermined threshold value, even when it is detected that leakage current exists. Assuming that the threshold value is set, for example, as 10 uA, control logic 550 may determine that at least a portion of the memory block in the memory device is disabled when the frequency of the clock signal CLK detected by the clock counter 541 is 25 MHz or greater.

In various example embodiments, different circuits for sensing leakage current may be constructed according to the internal configuration of the power circuit. For example, when the charge pump is in the power circuit, the frequency of the operating clock signal input to the charge pump may be detected to estimate whether leakage current exists and/or the magnitude of leakage current. When the charge pump is not in the power circuit, control logic may detect the frequency of a clock signal from the ring oscillator to estimate whether leakage current exists and/or the magnitude of leakage current. The ring oscillator may be driven by output current of the power circuit.

In example embodiments, the control logic may detect leakage current caused by a progressive defect occurring during use of the memory device, as well as leakage current caused by a defect resulting from a manufacturing process. Thus, the control logic may previously notify the user of a storage device in the memory device of the possibility of data loss caused by leakage current, thereby increasing product reliability.

Figure 10:
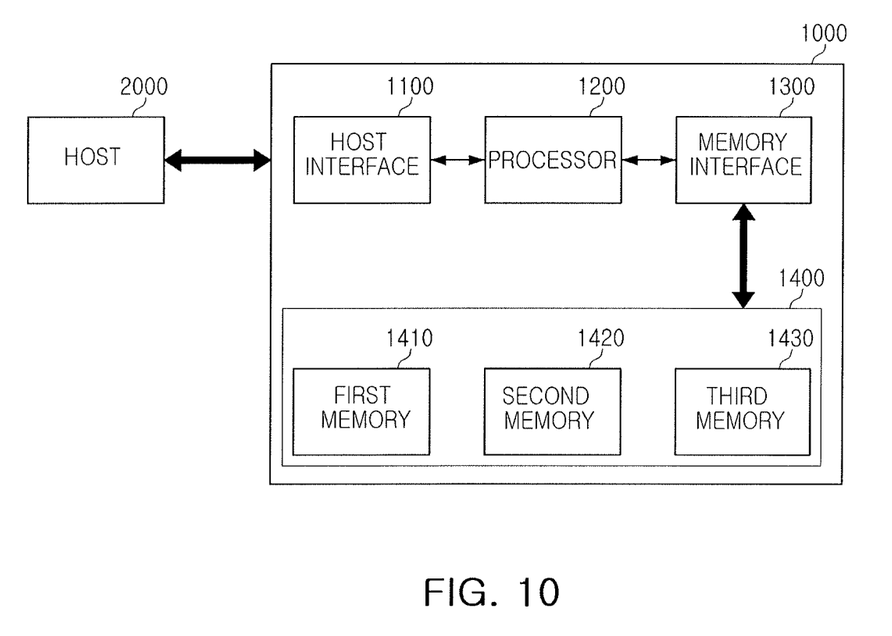
FIG. 10 illustrates an embodiment of an electronic device.

FIG. 10 illustrates an embodiment of an electronic device 1000 including a memory device. Referring to FIG. 10, the electronic device 1000 may include a host interface 1100, a processor 1200, a memory interface 1300, and a memory unit 1400. The memory unit 1400 may include first to third memories 1410 to 1430. In an example embodiment, the electronic device 1000 in FIG. 10 may be a solid state drive (SSD).

The processor 1200 may control the overall operation of the electronic device 1000 and may communicate with a host 2000 via the host interface 1100. The host 2000 may be an external device that is able to be connected to the electronic device 1000 and may be, for example, a computer, a tablet personal computer (PC), a set-top box, or a television. The processor 1200 may write data to each of the first to third memories 1410 to 1430 via the memory interface 1300, or may manage data written to each of the first to third memories 1410 to 1430.

The electronic device 1000 may include a power circuit that may generate various magnitudes of voltage or current for operations thereof. In an example embodiment, the power circuit may also be provided in an IC chip independent from the processor 1200. The power circuit may include a device for detecting leakage current according to various example embodiments. For example, the power circuit may include a counter circuit for detecting the frequency of a clock signal output by an oscillator. The processor 1200 may determine whether leakage current exists in the first to third memories 1410 to 1430 based on a frequency detected by the counter circuit. Further, the processor 1200 may allow the frequency, detected by the counter circuit, to be transmitted to the host 2000 and may also allow the host 2000 to determine whether leakage current has occurred.

When it is determined that leakage current has occurred, the processor 1200 may communicate with the host 2000 to notify the user of the electronic device 1000 of the leakage current, thus enabling the user to previously prepare for data loss. In an example embodiment, when leakage current has occurred in at least one of the first to third memories 1410 to 1430, the processor 1200 may also reduce or minimize data loss by stopping use of the at least one memory in which the leakage current has occurred.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The logic, counters, timers, generators, decoders, processors, and other signal generating and signal processing features of the disclosed embodiments may be implemented in logic which, for example, may include hardware, software, or both. When implemented at least partially in hardware, the logic, counters, timers, generators, decoders, processors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the logic, counters, timers, generators, decoders, processors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A device for detecting a leakage current, comprising:
   a voltage generator to output direct current (DC) power;
   a current mirror to replicate a current of the DC power and output a first current and a second current;
   an oscillator to be driven by the first current and the second current to generate a clock signal of a frequency that is based on the first current and the second current; and
   a counter to detect the frequency of the clock signal and to generate comparative data to detect a leakage current in the current of the DC power.

2. The device as claimed in claim 1, wherein the oscillator includes a ring oscillator.

3. The device as claimed in claim 1, wherein the counter includes:
   a clock counter to detect a cycle of the clock signal for a predetermined detection time; and
   a timer setting the predetermined detection time.

4. The device as claimed in claim 1, wherein the frequency of the clock signal is proportional to a magnitude of the leakage current in the current of the DC power.

5. The device as claimed in claim 1, further comprising:
   control logic to determine a magnitude of the leakage current in the current of the DC power based on the comparative data.

6. The device as claimed in claim 5, wherein the control logic, the voltage generator, the current mirror, the oscillator, and the counter are in a same integrated circuit (IC) chip.

7. A memory device, comprising:
   a plurality of memory elements;
   a controller integrated circuit (IC) to control the plurality of memory elements; and
   a power circuit to output a driving power for the controller IC and the plurality of memory elements, wherein the power circuit is to detect a frequency of at least one of clock signals generated in the power circuit and to generate comparative data and wherein the controller IC is to detect a leakage current in the driving power based on the comparative data, wherein, the power circuit includes:
   a clock counter to count a number of cycles of the at least one of clock signals for a predetermined detection time;
   a voltage generator to output direct current (DC) power as the driving power;
   a current mirror to replicate a current of the DC power and output a first current and a second current; and
   an oscillator to be driven by the first current and the second current to generate the at least one of clock signals,
   wherein the controller IC is to detect the leakage current in the DC power.

8. The memory device as claimed in claim 7, wherein the frequency of the at least one of clock signals is indicative of the leakage current in the DC power.

* * * * *